(12) United States Patent
Gueorguiev et al.

(10) Patent No.: US 9,880,587 B2
(45) Date of Patent: Jan. 30, 2018

(54) DOCK FOR A MOBILE DEVICE

(71) Applicant: HEWLETT-PACKARD DEVELOPMENT COMPANY, L.P., Houston, TX (US)

(72) Inventors: George Hristov Gueorguiev, Fort Collins, CO (US); Lisa A Yunker, Fort Collins, CO (US); Ryan John Handy, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 15/111,542

(22) PCT Filed: Feb. 26, 2014

(86) PCT No.: PCT/US2014/018501
§ 371 (c)(1),
(2) Date: Jul. 14, 2016

(87) PCT Pub. No.: WO2015/130266
PCT Pub. Date: Sep. 3, 2015

(65) Prior Publication Data
US 2016/0357220 A1   Dec. 8, 2016

(51) Int. Cl.
*G06F 1/16* (2006.01)
*G06F 13/00* (2006.01)
*H05K 5/02* (2006.01)

(52) U.S. Cl.
CPC .......... *G06F 1/1632* (2013.01); *G06F 1/1662* (2013.01); *G06F 1/1669* (2013.01); *H05K 5/0217* (2013.01); *H05K 5/0247* (2013.01)

(58) Field of Classification Search
CPC ..................................................... G06F 1/1632
USPC ................ 361/679.41–679.45; 710/303, 304
See application file for complete search history.

(56) References Cited

U.S. PATENT DOCUMENTS

| | | | |
|---|---|---|---|
| 6,301,106 B1* | 10/2001 | Helot | G06F 1/1632 320/107 |
| 9,207,714 B2* | 12/2015 | Boomhour | G06F 1/1632 |
| 2003/0025674 A1 | 2/2003 | Watanabe | |
| 2005/0055487 A1 | 3/2005 | Tanaka et al. | |

(Continued)

OTHER PUBLICATIONS

"Belkin Docking Station for Windows Tablets or Ultrabooks", < http://www.displaylink.com/shop/hot_products.php >, Nov. 2, 2013.

(Continued)

*Primary Examiner* — Nidhi Thaker
(74) *Attorney, Agent, or Firm* — International IP Law Group (57) ABSTRACT

Disclosed herein is dock for a mobile device. An example of a dock includes an enclosure and an adjustable shelf. The enclosure includes a sloped top surface to support a display of a mobile device at a viewing angle, wherein a slope of the sloped top surface is due to a height of the enclosure being shorter at a front of the enclosure than a back of the enclosure. The shelf adjustable shelf is coupled to a top front edge of the enclosure by a hinge, wherein the adjustable shelf is to receive the mobile device, and the adjustable shelf rests flat against the sloped top surface to support the display at a default viewing angle, and the adjustable shelf is pivotable around the hinge to adjust the viewing angle.

14 Claims, 5 Drawing Sheets

(56) References Cited

U.S. PATENT DOCUMENTS

| | | | |
|---|---|---|---|
| 2006/0061961 A1* | 3/2006 | Yin | G06F 1/1632 361/679.43 |
| 2010/0195279 A1* | 8/2010 | Michael | G06F 1/1632 361/679.41 |
| 2010/0265652 A1* | 10/2010 | Agata | G06F 1/1632 361/679.41 |
| 2011/0149510 A1* | 6/2011 | Monsalve | F16M 11/10 361/679.55 |
| 2012/0189156 A1 | 7/2012 | Leung | |
| 2013/0058022 A1* | 3/2013 | Knutson | G06F 1/1632 361/679.01 |
| 2013/0058065 A1 | 3/2013 | Minaguchi et al. | |
| 2014/0313663 A1* | 10/2014 | Ashcraft | G06F 1/1632 361/679.44 |

OTHER PUBLICATIONS

Miles; "Best iPad Stands Worth Buyjng", < http://www.pocket-lint.com/news/105114-best-ipad-stands-to-buy >, Aug. 2, 2010.

\* cited by examiner

DOCK FOR A MOBILE DEVICE

BACKGROUND

Mobile devices such as tablets and smartphones may be coupled to a dock. A mobile computing device may include a computing device having a small form factor or all-in-one functionality.

BRIEF DESCRIPTION OF THE DRAWINGS

Certain examples are described in the following detailed description and in reference to the drawings, in which.

DETAILED DESCRIPTION OF SPECIFIC EXAMPLES

The techniques described herein include a dock configured to couple with a mobile device to add functionality to the mobile device that is otherwise unavailable. A mobile device, as referred to herein, is a computing device wherein components, such as a processing device, a storage device, and a display device are disposed within a single housing. A dock is a component configured to couple a mobile device to components of the dock. The dock is configured with a sloped top surface and an adjustable shelf. The dock is configured such that the viewing angle of the mobile device, once coupled via a connector of the dock, can be adjusted and locked into an ideal ergonomic position by adjustment of the shelf. The sloped surface of the shelf may enable a default viewing angle for users of the mobile device, wherein the viewing angle may be adjustable by the shelf built into the device. As a result of the sloped surface, a back of the dock may have a taller height than a front of the dock having a shorter height. As used herein, the back of the dock refers to the side of the dock farthest away from the user during normal use of the dock, while the front of the dock refers to the side of the dock closest to the user during normal use of the dock.

The slope of the dock provides a larger volume towards the back of the dock than towards the front. As used herein, the dock includes a taller face vertically oriented along a back side of the dock and a shorter face vertically oriented along a front side of the unit, wherein the front side faces the user. The taller face creates a larger volume within the back side of the unit, allowing for the installation of drives, storage, and the like. The shorter face creates a smaller volume towards the front side of the unit. Other devices, such as display, ports, USB ports, and the like, may be installed towards the front side of the unit. For example, the dock may include expansion bays that can receive hard drives, optical disk drives, and the like. The larger volume towards the back of the dock may enable larger components to be located towards the back the dock while smaller components may be disposed near the front. For example, the components disposed towards the back may include expansion bays that are larger components of the dock than components that are disposed towards the front.

Figure 1:
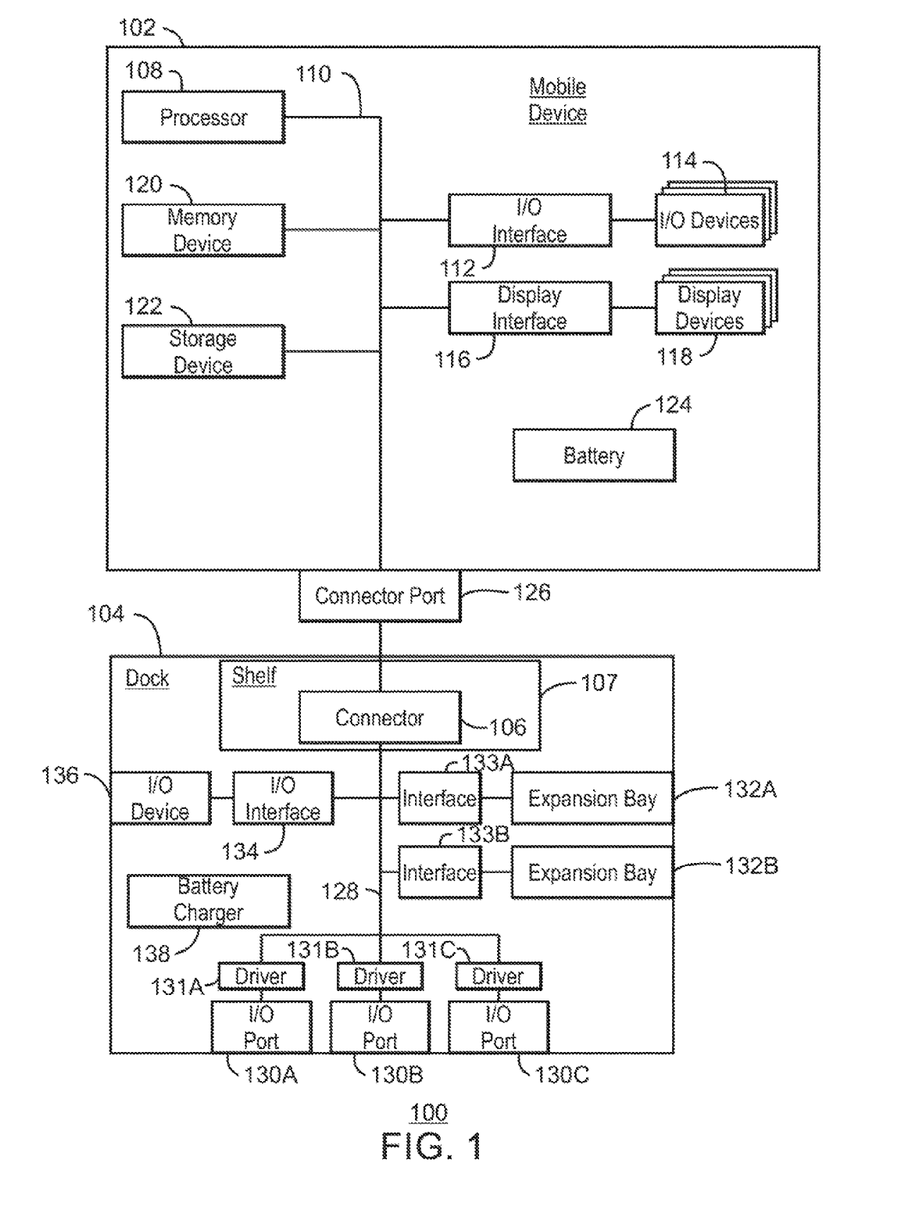
FIG. 1 is a block diagram of a system for coupling a mobile device to a dock, in accordance with examples of the present disclosure.

FIG. 1 is a block diagram of a system for coupling a mobile device to a dock, in accordance with examples of the present disclosure. A mobile device 102 can be communicatively coupled to a dock 104 via a connector 106. In some examples, the connector 106 is disposed on a shelf 107 that supports the mobile device 102 at a convenient, user-selectable viewing angle. The shelf 107 is described further below with reference to FIGS. 2-4. The dock 104 may include multiple components expanding the functionality of the mobile device. As discussed in more detail below, the components of the dock may include expansion bays, including expansion bay interfaces, to receive pluggable storage devices and communicatively couple the mobile device 102 to the pluggable storage devices. The shape of the dock 104 (shown in FIG. 2) provides a large surface area for disposing larger components such as pluggable storage devices, while still maintaining a compact form factor.

The mobile device 102 is a computing device wherein components such as a processing device, a storage device, and a display device are disposed within a single housing. For example, the mobile device 102 may be a tablet computer, a smartphone, a handheld videogame system, a cellular phone, an all-in-one slate computing device, or any other computing device having all-in-one functionality wherein the housing of the computing device houses the display was well as components such as storage components and processing components.

The connector 106 may be a Universal Serial Bus (USB) port, or a proprietary connector port. For example, the connector may be a 30 pin connector implemented in mobile computing devices such as smartphones and tablets. Other connectors may be used. In some examples, the connector 106 may be a wireless transceiver to communicatively couple with the mobile device 102 through wireless gigabit alliance (WiGig) protocol or other wireless communication protocols.

The mobile device 102 may include a processor 108 that is adapted to execute stored instructions. The processor 108 can be a single core processor, a multi-core processor, a computing cluster, or any number of other appropriate configurations.

The processor 108 may be connected through a system bus 110 to an input/output (I/O) interface 112 adapted to couple the mobile device 102 to an I/O device 114. The I/O device 114 may be, for example, a touchpad, a touchscreen, physical buttons, or capacitive sensors, among others. In some examples, the I/O device 114 is a built-in component of the mobile device 102.

The processor 108 may also be linked through the system bus 110 to a display device interface 116 adapted to couple the mobile device 102 to a display device 118. The display device 118 may be a display screen that is a built-in component of the mobile device 102.

The processor 108 may also be linked through the system bus 110 to a memory device 120. In some examples, the memory device 120 can include random access memory (RAM), read only memory (ROM), non-volatile memory, or any other suitable memory systems.

The processor 108 may also be linked through the system bus 110 to a storage device 122. In some examples, the mobile device 102 further includes a rechargeable battery 124 to provide power to the mobile device 102.

The processor 108 may also be linked through the system bus 110 to a connector port 126 adapted to couple with the connector 106 on the dock 104, such that the processor 108 can communicate with various modules linked through the dock's system bus 128. The various modules of the dock may include input/output ports 130, expansion bays 132, and input/output devices 136.

As discussed above, the expansion bays 132 may provide additional functionality to the mobile device 102. For example, when coupled to the dock 104, the processor 108 may be linked through the dock's system bus 128 to the expansion bays 132 via expansion bay interfaces 133A and 133B. The expansion bays 132 can enable the processor 108 to interact with pluggable storage devices or other media. For example, expansion bay 132a may house an optical disc drive. The interface 133a can enable the processor 108 to interact with the optical disc drive. In another example, expansion bay 132b may house a hard disk drive. The interface 133b may enable the processor 108 to read and write to the hard disk drive. In other examples, the expansion may house a solid state drive associated with a driver interface such as drive interfaces 133a and 133b.

When coupled to the dock 104, the processor 108 of the mobile computing device 102 is communicatively coupled through the dock's system bus 128 to input/output (I/O) ports 130. For example, I/O port 130a may be a universal serial bus (USB) 2.0/3.0 port. A driver 131a linked to the USB port may contain firmware to enable the processor 108 to receive and transmit data using the USB port. In another example, I/O port 130b may be a High Definition Multimedia Interface (HDMI) port. A driver 131b linked to the HDMI port may contain firmware to enable the processor 108 to receive and transmit in an HDMI protocol via the HDMI port 131b. In another example, port 130c may be an audio in/out port. A driver 131c linked to the audio in/out port may contain firmware to enable the processor to receive and transmit audio data using the audio in/out port. Further examples of I/O ports 130 may include DisplayPort and Digital Visual Interface (DVI) ports, among others.

When coupled to the dock 104, the processor 108 may also be linked through the dock's system bus 128 to an input/output (I/O) interface 134 adapted to couple the mobile device 102 to an input/output (I/O) device 134. The I/O device 136 may be built in or coupled to the dock 104.

In examples, the I/O device 136 may be a keyboard, a trackpad, a touchscreen, or a mouse, among others, that is built in to the dock 104. As discussed in more detail below, the I/O device 136 may be a keyboard that slides out of the dock 104. The integration of the I/O device 136 as a part of the dock 104 may enable the mobile computing device 100 to be used at a dedicated workstation or desk, thereby enabling portability of a tablet or all-in-one device without sacrificing functionality and connectivity of a desktop computing device or a laptop computing device for example.

The dock 104 can further include a battery charger 140 to recharge the battery 124 of the mobile device 102. In some examples, the battery charger 138 can recharge the battery 124 of the mobile device 102 through the dock's system bus 128 when the mobile device 102 is coupled to the dock 104 via the connector 106. In some examples, the battery charger 138 can recharge the battery 124 through an electrical line to be connected to the mobile device 102. In some examples, the battery charger 138 can recharge the battery 124 through wireless means, such as inductive charging. In some examples, the battery charger 138 of the dock 104 is coupled an induction coil to create an electromagnetic field from within the dock 104. The mobile device 102 may be configured to receive power from the electromagnetic field and convert the power into usable electrical energy for the battery.

Figure 2:
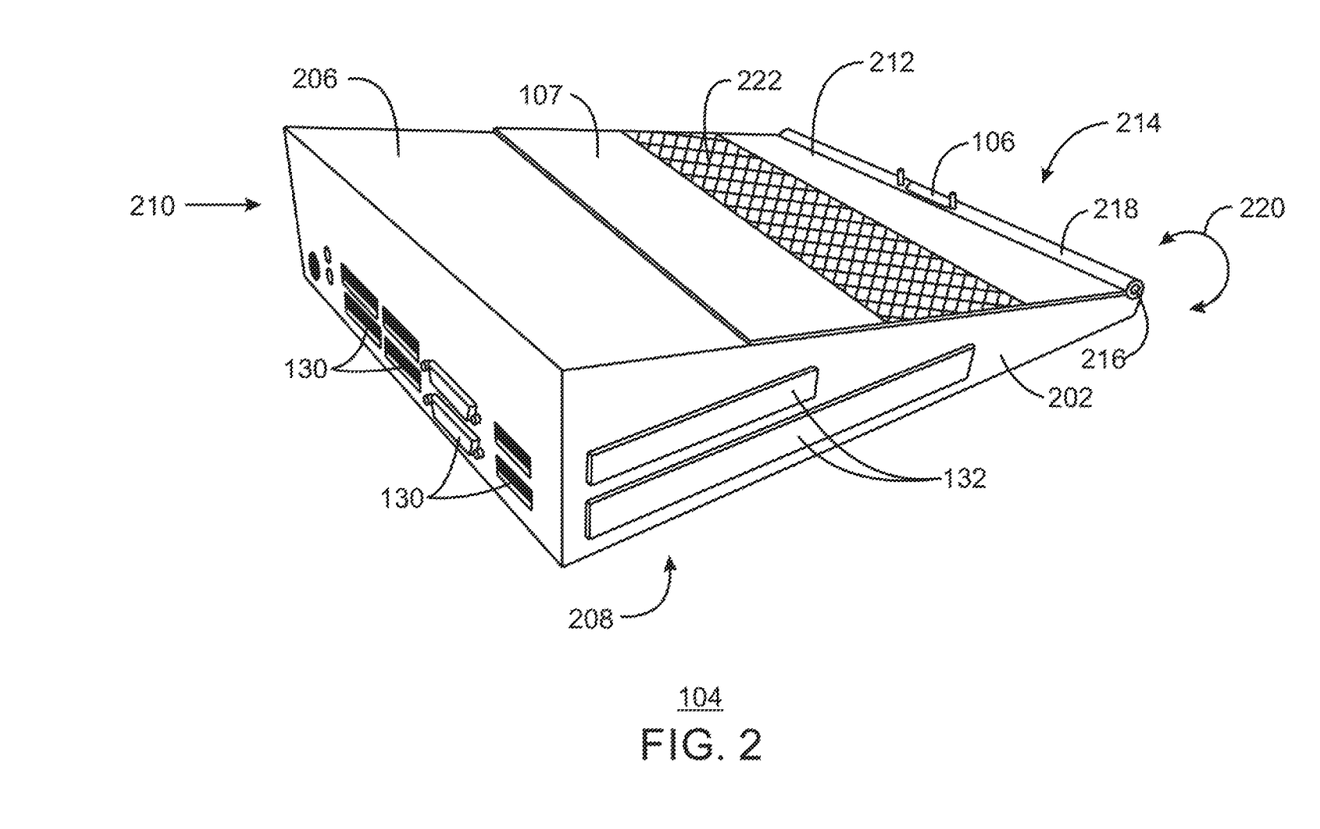
FIG. 2 is a perspective view of a dock for a mobile device.

FIG. 2 is a perspective view of a dock for a mobile device. The dock 104 is shown in FIG. 2 as having an enclosure 202, a shelf 107, and a connector 106. A mobile device, such as the mobile device 104 discussed above in reference to FIG. 1, can be communicatively coupled to the dock 104 via the connector 106 to receive additional functionality. The enclosure 202 serves as a base of the dock 104 and may include a top surface 206 and a bottom surface, generally indicated at 208. As illustrated in FIG. 2, the top surface 206 of the dock 104 may be sloped at an angle with regard to the bottom surface 208. The sloped top surface 206 may provide a default viewing angle for a mobile computing device placed on the dock 104. For example, the default angle of the top surface 206 in relationship to the bottom surface 207 may be approximately 22 degrees. As discussed above, the sloped top surface 206 may enable larger components to be disposed within the dock 104 near a back of the enclosure 202, as indicated by the arrow 210. The shelf 107 can be coupled to an edge 212 of a front of the enclosure 202, generally indicated at 214. Further, as discussed in more detail below, the shelf 107 may be adjustable to enable a user to adjust a viewing angle to an angle other than the default angle of the sloped top surface 206.

The connector 106 is a fixture disposed on an edge of the shelf 107 having an adjustable hinge, and may be a data and power connector to provide signals including audio signals, video signals, input/output signals, storage interface signals such as serial attached technology attachment (SATA) interface signals, and the like. The connector 106 enables added functionality to the mobile device. For example, the dock may include input/output ports, expansion bays, a battery charging mechanism, and a keyboard to be used in conjunction with the mobile device, as discussed in more detail below.

As illustrated in FIG. 2, in examples, the shelf 107 may rest flush with the sloped top surface 206 of the enclosure 202. The shelf 107 may be coupled to the enclosure 202 by any type of pivotable coupling such as a hinge indicated at 216. The hinge 216 may enable an angle of the shelf 107 to be adjusted with respect to the sloped top surface 206. In some examples, the shelf 107 includes a ledge 218 to impede the mobile device 102 from sliding past the ledge 216. The ledge 218 may be a monolithic portion of the shelf 107. However, in some examples, the ledge 218 may be a discrete element separate from the 107, while being coupled to the shelf 107. In some examples, the ledge 218 forms a housing for the hinge 216, such that rotation of the hinge 216 may rotate the ledge as indicated by the arrow 220, as well as rotation of the connector 106 disposed on the ledge 218.

In some examples, the shelf 107 has a frictional surface 222 having a frictional coefficient that is greater than a frictional coefficient than that of a backside of the mobile device 102 to be placed on the dock 104. The frictional surface 222 may reduce or prevent the mobile device 102 from sliding. The frictional surface 222 may composed of a frictional material such as a rubber surface coating, a granular surface coating, or any other coating to increase the frictional coefficient between the shelf 107 and the mobile device 102.

As discussed above, the sloped top surface 206 of the enclosure 202 may provide for larger components to be stored near the back 210 of the dock 104. As illustrated in FIG. 2, the front 214 of the dock 104 may be thinner than the back 210 of the dock 104. In some examples, the enclosure 202 includes input/output ports, such as the input/output ports 130 discussed above in reference to FIG. 1. The enclosure 202 can also include expansion bays, such as the expansion bays 132 discussed above in reference to FIG. 1. Each of the expansion bays 132 may receive various types of pluggable components. In some scenarios, the expansion bays 132 can include optical disk drives. In other scenarios, the expansion bays 132 can include storage devices, such as a hard disk drive, or a solid state drive. In other scenarios, the expansion bays 132 include any combination of optical disk drives, hard disk, solid state drives, and the like.

As discussed above, the connector 106 is disposed on the ledge 218. The ledge 218 including the connector 106 may rotate when the shelf 107 is rotated. In examples, the connector 106 is implemented as an electro-mechanical device enabling signals to be communicated in various rotated positions, such as a slip ring, a rotary connector, or any other rotary electrical interface. In some examples, the connector 106 may be a Universal Serial Bus (USB) port, or a proprietary connector port. For example, the connector may be a 30 pin connector implemented in mobile computing devices such as smartphones and tablets. Other connectors may be used. In some examples, the connector 106 may be a wireless transceiver to wirelessly couple with a wireless transceiver in the mobile device 102 via wireless signaling. For example, the mobile device 102 can communicatively couple via WiGig, a wireless local area network (WLAN), or using Bluetooth signaling.

Figure 3:
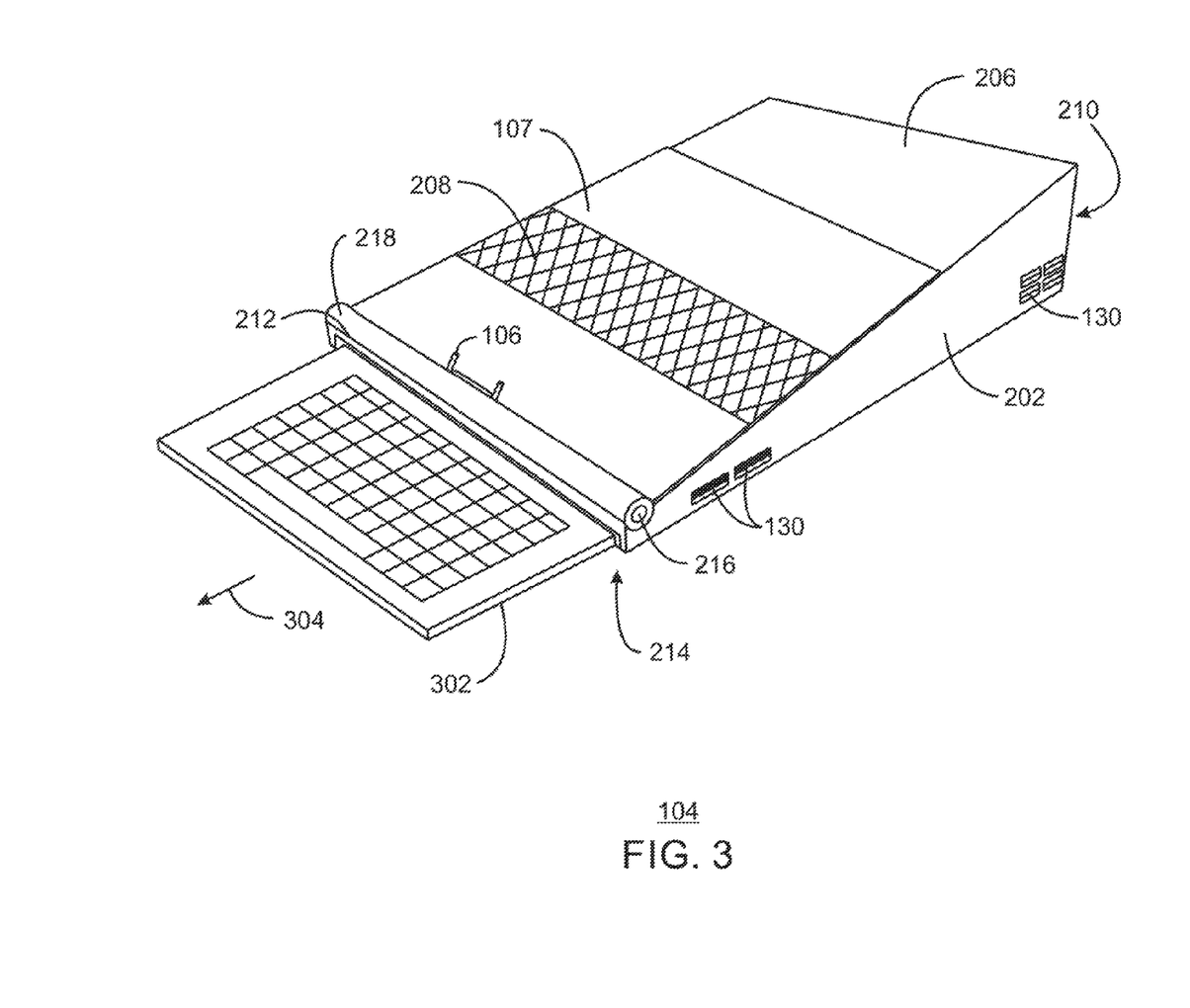
FIG. 3 is a perspective view of the dock for a mobile device including a keyboard.

FIG. 3 is a perspective view of the dock for a mobile device including a keyboard. As illustrated in FIG. 3, the dock may include a keyboard 302 to slide out of the enclosure 202, as indicated by the arrow 304. As discussed above, the mobile device 102 can communicatively couple to the dock 104 via the connector 106 to receive additional functionality. The keyboard 302 may provide conversion of a mobile computing device to a desktop environment, wherein connection of the mobile device 102 to the dock 104 enables full keyboard functionality.

The keyboard 306 may be built into the dock 104. In some examples, the keyboard 306 may slide out from inside the enclosure 202, as shown in FIG. 3. In this scenario, the dock may include a keyboard drawer (not shown) built into the dock 104. The built-in keyboard drawer may provide a convenient input method built into the dock.

Figure 4:
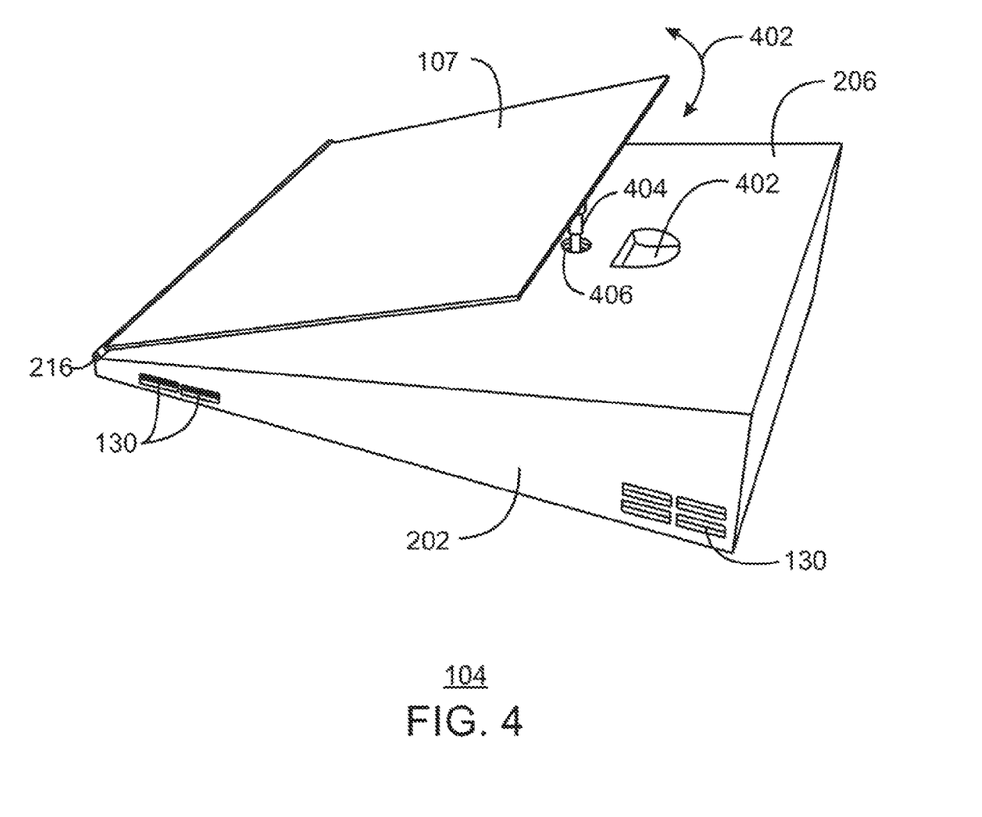
FIG. 4 is a perspective view of the dock having a lower arm to support the shelf at a desired angle.

FIG. 4 is a perspective view of the dock having a lower arm to support the shelf at a desired angle. As illustrated in FIG. 4, the shelf 107 may rotate as indicated by the arrow 402. In some examples, the shelf 107 may be locked by way of the hinge 216. For example, the hinge 216 may be a self-locking hinge. In examples, the shelf 107 may be locked by a supporting arm 404. The supporting arm 404 may be coupled to an underside of the shelf 107. In examples, the supporting arm 404 may be a telescoping arm configured to be adjustable depending on the adjusted angle of the shelf 107. In examples, the supporting arm 404 may be received into one of multiple grooves of the top surface 206 of the enclosure 202, as indicated at 406. The viewing angle of the mobile device 104 may thereby be adjusted and locked using a self-locking mechanism of the hinge 216, the support arm 404 received in the groove 406, or any combination thereof.

In some examples, the top surface 206 may include a recess 408. The recess 408 may enable a user to pull up on the shelf 107 to adjust the angle of the shelf 107. The recess 408 may be a depression within the enclosure 202 at the top surface such that an edge of the shelf 107 may be pulled by the user.

Figure 5:
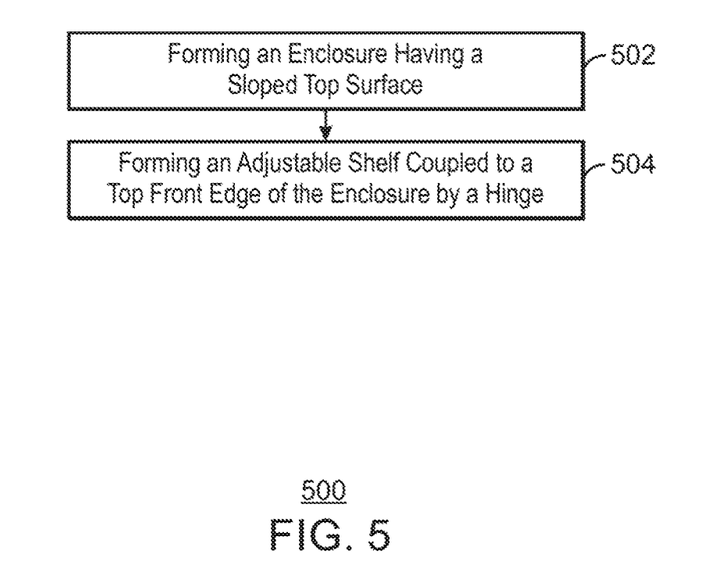
FIG. 5 is a process flow diagram of a method for manufacturing a dock for a mobile device, in accordance with examples of the present disclosure.

FIG. 5 is a process flow diagram of a method for manufacturing a dock for a mobile device, in accordance with examples of the present disclosure. The method 400 can be used to manufacture a dock 104 as described with regards to FIGS. 1-4.

At block 502, an enclosure is formed. The enclosure includes a top surface and a bottom surface. The top surface to support a display of an electronic device at a viewing angle. The slope of the sloped top surface is due to a height of the enclosure being shorter at a front of the enclosure than a back of the enclosure.

At block 504, an adjustable shelf is formed. The adjustable shelf is coupled to a top front edge of the enclosure by a hinge. The adjustable shelf is to receive the electronic device, such as a mobile computing device. The adjustable shelf rests flat against the sloped top surface to support the display at a default viewing angle, and the adjustable shelf is pivotable around the hinge to adjust the viewing angle.

In examples, a connector is disposed to the dock. The connector can be used to communicatively couple with the mobile device. The mobile device includes a processing component, a storage component, and the display device, wherein the mobile device components are disposed within, a single housing. The connector is to communicatively couple the components of the mobile to device to components of the enclosure. The connector may provide multiple connectivity features communicating data such as storage data to and from the mobile device, audio data to and from the mobile device, processor data to and from the mobile device, video, data to and from the mobile device, and the like.

As discussed above, the method 500 may include forming the dock such that a top surface is sloped. The angle between the top surface of the dock and the enclosure of the dock may be configurable by the manufacturer. In some examples, the angle may be a default angle of about 22 degrees between a plane of a bottom surface of the enclosure to a plane of the top surface of the enclosure.

In some examples, additional components that can add functionality to the mobile device are disposed to the dock. The additional components may include input/output ports, an expansion bay, an input/output device, and a battery charger. Examples of input/output ports include USB 2.0/3.0 ports, HIM ports, DisplayPort, DVI ports, audio in/out ports, and the like. The expansion bay can house devices such as an optical disk drive, a hard disk drive, and a solid state drive.

In some examples, the hinge can enable the shelf to rotate, thus enabling a user to adjust the angle between the shelf and the top surface of the enclosure. In some examples, a support arm is disposed to a bottom surface of the shelf, such that the support arm extends downward toward the top surface of the enclosure, thus propping up the shelf at a desired angle.

In some examples, an input/output device is disposed in the dock. The input/output device can interact with the mobile device via the connector. For example, the input/output device can be a keyboard that can slide out from underneath the dock.

While the present techniques may be susceptible to various modifications and alternative forms, the examples discussed above have been shown only by way of example. It is to be understood that the technique is not intended to be limited to the particular examples disclosed herein. Indeed, the present techniques include all alternatives, modifications, and equivalents falling within the true spirit and scope of the appended claims.

What is claimed is:

1. A dock for a mobile device, comprising: an enclosure comprising a sloped top surface to support a mobile device that includes a display screen, wherein the sloped top surface supports the mobile device at a viewing angle and a slope of the sloped top surface is due to a height of the enclosure being shorter at a front of the enclosure than a back of the enclosure, wherein the viewing angle is an angle between a bottom surface of the enclosure and a line normal to the display screen; a horizontal hinge coupled to a top front edge of the enclosure and running parallel to the top front edge of the enclosure; and an adjustable shelf coupled to the top front edge of the enclosure by the horizontal hinge, wherein the adjustable shelf is to receive the mobile device, and the adjustable shelf rests flat against the sloped top surface to support the mobile device at a default viewing angle, and the adjustable shelf is pivotable around the horizontal hinge to adjust the viewing angle, wherein the adjustable shelf comprises a ledge that houses the horizontal hinge, and wherein the ledge comprises a connector to communicatively couple the mobile device to electronic components disposed in the enclosure.

2. The dock of claim 1, wherein the surface of the shelf comprises a frictional element to increase a coefficient of friction between a backside of the mobile device and the surface of the shelf.

3. The dock of claim 1, the enclosure comprising:
an input/output driver to carry out input/output operations; and
an input/output port to be communicatively coupled to the mobile device via the input/output driver, and via a connector of the dock.

4. The dock of claim 1, the enclosure comprising an expansion bay to be communicatively coupled to the mobile device via a connector, wherein the expansion bay comprises a receiver to receive pluggable storage components.

5. The dock of claim 1, the enclosure comprising a keyboard to be slideably received into the enclosure, such that the keyboard is to be communicatively coupled to the mobile device via a connector.

6. The dock of claim 1, the enclosure comprising a battery charger to recharge a battery of the mobile device.

7. A method of forming a dock for a mobile device, comprising: forming an enclosure comprising a sloped top surface to support a mobile device that includes a display screen, wherein the sloped top surface supports the mobile device at a viewing angle and a slope of the sloped top surface is due to a height of the enclosure being shorter at a front of the enclosure than a back of the enclosure, wherein the viewing angle is an angle between a bottom surface of the enclosure and a line normal to the display screen; coupling a horizontal hinge to a top front edge of the enclosure and running parallel to the top front edge of the enclosure; and forming an adjustable shelf coupled to the top front edge of the enclosure by the horizontal hinge, wherein the adjustable shelf is to receive the mobile device, and the adjustable shelf rests flat against the sloped top surface to support the mobile device at a default viewing angle, and the adjustable shelf is pivotable around the horizontal hinge to adjust the viewing angle; and wherein the adjustable shelf comprises a ledge that houses the horizontal hinge, and wherein the ledge comprises a connector to communicatively couple the mobile device to electronic components disposed in the enclosure.

8. The method of claim 7, wherein the surface of the shelf comprises a frictional element to increase a coefficient of friction between a backside of the mobile device and the surface of the shelf.

9. The method of claim 7, comprising disposing:
an input/output driver in the enclosure to carry out input/output operations; and
an input/output port in the enclosure to be communicatively coupled to the mobile device via the input/output driver and via a connector of the dock.

10. The method of claim 7, comprising disposing an expansion bay in the enclosure, the expansion bay to communicatively couple with the mobile device via a connector of the dock, wherein the expansion bay comprises a receiver to receive pluggable storage components.

11. The method of claim 7, comprising coupling a keyboard to be slideably received into the enclosure, such that the keyboard is to be communicatively coupled with the mobile device via a connector of the dock.

12. The method of claim 7, comprising disposing a battery charger to the enclosure, the charger to recharge a battery of the mobile device.

13. A docking station for a tablet computer, comprising: a base with a sloped top surface to support a display screen of the tablet computer at a viewing angle wherein the viewing angle is an angle between a bottom surface of the base and a line normal to a display screen of the tablet computer; a horizontal pivotable coupling coupled to a lowest edge of the sloped too surface and running parallel to the lowest edge of the sloped too surface; and a shelf coupled to the lowest edge of the sloped top surface by the horizontal pivotable coupling and configured to receive the tablet computer, the shelf comprising a ledge that houses the horizontal pivotable coupling, wherein the ledge comprises a connector to communicatively couple the tablet computer to electronic components disposed in the base; wherein the adjustable shelf rests flat against the sloped top surface of the base to support the tablet computer at a default viewing angle and wherein the shelf is pivotable about the horizontal pivotable coupling to adjust a viewing angle of the tablet computer.

14. The docking station of claim 13, wherein the electronic components disposed in the base include a retractable keyboard.

* * * * *

UNITED STATES PATENT AND TRADEMARK OFFICE
CERTIFICATE OF CORRECTION

PATENT NO. : 9,880,587 B2  
APPLICATION NO. : 15/111542  
DATED : January 30, 2018  
INVENTOR(S) : George Hristov Gueorguiev et al.

Page 1 of 1

It is certified that error appears in the above-identified patent and that said Letters Patent is hereby corrected as shown below:

In the Claims

Column 8, Line 33, Claim 13, delete "angle" and insert -- angle, --, therefor.

Column 8, Line 37, Claim 13, delete "too" and insert -- top --, therefor.

Column 8, Line 38, Claim 13, delete "too" and insert -- top --, therefor.

Signed and Sealed this  
Third Day of July, 2018

Andrei Iancu  
*Director of the United States Patent and Trademark Office*